US012704563B2

(12) United States Patent
Parkhurst et al.

(10) Patent No.: US 12,704,563 B2
(45) Date of Patent: Aug. 11, 2026

(54) MAGNETIC GAIN CORRECTION OF HALL EFFECT SENSORS

(71) Applicant: TEXAS INSTRUMENTS INCORPORATED, Dallas, TX (US)

(72) Inventors: Charles Parkhurst, Murphy, TX (US); Keith Ryan Green, McKinney, TX (US); Gabriel De La Cruz Hernandez, Dallas, TX (US); Sergio Orjuela, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 192 days.

(21) Appl. No.: 18/789,985

(22) Filed: Jul. 31, 2024

(65) Prior Publication Data

US 2025/0237716 A1 Jul. 24, 2025

Related U.S. Application Data

(60) Provisional application No. 63/623,956, filed on Jan. 23, 2024.

(51) Int. Cl.

*G01R 33/07* (2006.01)
*G01K 7/16* (2006.01)
*G01R 33/00* (2006.01)

(52) U.S. Cl.

CPC ........... *G01R 33/0082* (2013.01); *G01K 7/16* (2013.01); *G01R 33/07* (2013.01)

(58) Field of Classification Search

CPC ................ G01R 33/07; G01R 33/0082; G01R 19/0092; G01R 33/072; G01R 15/146; G01R 19/0084; G01R 21/14; G01R 33/0041; G01R 33/0035; G01R 33/09; G01R 15/202; G01D 5/142; G01D 18/00; H10N 52/00; G01K 7/16

See application file for complete search history.

(56) References Cited

U.S. PATENT DOCUMENTS

| | | | | |
|---|---|---|---|---|
| 5,055,768 A * | 10/1991 | Plagens | G01R 33/07 | 324/225 |
| 6,104,231 A * | 8/2000 | Kirkpatrick, II | G01R 33/07 | 327/513 |
| 9,898,029 B2 * | 2/2018 | Rasmus | G05F 3/262 | |
| 11,196,391 B2 * | 12/2021 | Staudinger | H03F 3/04 | |

OTHER PUBLICATIONS

Dan Stoica et al. "A Dual Vertical Hall Latch with Direction Detection". Downloaded on Dec. 8, 2023 from IEEE Xplore.

* cited by examiner

*Primary Examiner* — Vinh P Nguyen

(74) *Attorney, Agent, or Firm* — Xianghui Huang; Frank D. Cimino

(57) ABSTRACT

A circuit includes a bias current generator, a temperature compensation circuit, and a Hall effect sensor. The bias current generator has a first input, a second input, a first terminal, and a second terminal. The bias current generator includes a resistor circuit having a first terminal and a second terminal coupled to the first terminal and the second terminal of the bias current generator respectively. The temperature compensation circuit has a first input, a second input coupled to the first input of the bias current generator, and an output coupled to the second input of the bias current generator. The Hall effect sensor has a first terminal coupled to the first terminal of the bias current generator, a second terminal, a third terminal, and a fourth terminal.

20 Claims, 7 Drawing Sheets

500

$I_{tc}$
$V_{DD}$
$I_{ztc}$
$I_{ztc}$
$V_{BG}$
$V_{temp}$
106
402
404
502
504
506
508
510
512
514
516
518
520
522
524
526
528
530
532
534
536
538
540
542

MAGNETIC GAIN CORRECTION OF HALL EFFECT SENSORS

CROSS-REFERENCE TO RELATED APPLICATION

This Application claims the benefit of U.S. Provisional Application No. 63/623,956, filed on Jan. 23, 2024, the contents of which are hereby incorporated by reference in their entirety.

BACKGROUND

A Hall effect sensor is a type of sensor that can be used to sense magnetic field applied to the sensor. When a bias current is provided to the Hall effect sensor, a voltage is generated proportional to the magnetic field applied to the sensor.

SUMMARY

A first example circuit includes a bias current generator, a temperature compensation circuit, and a Hall effect sensor. The bias current generator has a first input, a second input, a first terminal, and a second terminal. The bias current generator includes a resistor circuit having first and second terminals coupled to the first and second terminals of the bias current generator respectively. The temperature compensation circuit has a first input, a second input coupled to the first input of the bias current generator, and an output coupled to the second input of the bias current generator. The Hall effect sensor has a first terminal coupled to the first terminal of the bias current generator, a second terminal, a third terminal, and a fourth terminal.

A second example circuit includes a reference current generator, a current mirror, a Hall effect sensor, a temperature sensor, and a temperature compensation circuit. The reference current generator has an input, a first terminal, and a second terminal. The reference current generator includes a resistor circuit having a first terminal coupled to the first terminal of the reference current generator and a second terminal coupled to the second terminal of the reference current generator. The current mirror has a first terminal, a second terminal coupled to the first terminal of the reference current generator, a third terminal, and a fourth terminal coupled to the second terminal of the reference current generator. The Hall effect sensor has a first terminal coupled to the first terminal of the current mirror and a second terminal coupled to the third terminal of the current mirror. The temperature sensor has an output. The temperature compensation circuit has a first input coupled to the output of the temperature sensor, a second input coupled to the input of the reference current generator, and an output coupled to the second terminal of the current mirror A temperature compensation circuit has a first input, a second input, and an output. The temperature compensation circuit includes a first current source, a first transistor, a second transistor, a third transistor, and a fourth transistor. The first current source has an input and an output. The first transistor has a first terminal coupled to the output of the first current source, a second terminal, and a control terminal coupled to the first terminal. The second transistor has a first terminal coupled to the second terminal of the first transistor, a second terminal, and a control terminal coupled to the first input of the temperature compensation circuit. The third transistor has a first terminal coupled to the input of the first current source, a second terminal, and a control terminal coupled to the control terminal of the first transistor. The fourth transistor has a first terminal coupled to the second terminal of the third transistor, a second terminal coupled to the output of the temperature compensation circuit, and a control terminal coupled to the second input of the temperature compensation circuit.

DETAILED DESCRIPTION

The drawings are not drawn to scale.

A Hall effect sensor is a type of sensor that can be used to sense magnetic field. When a bias current is provided to the Hall effect sensor along a first axis, a voltage proportional to a sensed magnetic field is produced across the Hall effect sensor along a second axis according to a magnetic gain of the Hall effect sensor.

The magnetic gain of the Hall effect sensor may be a function of the biasing current and a magnetic sensitivity of the Hall effect sensor, which may be a function of temperature. To improve the accuracy of the Hall effect sensor, the present description relates to techniques and circuitry for applying temperature compensation to Hall effect sensors by adjusting the bias current in response to changes in temperature.

Figure 1:
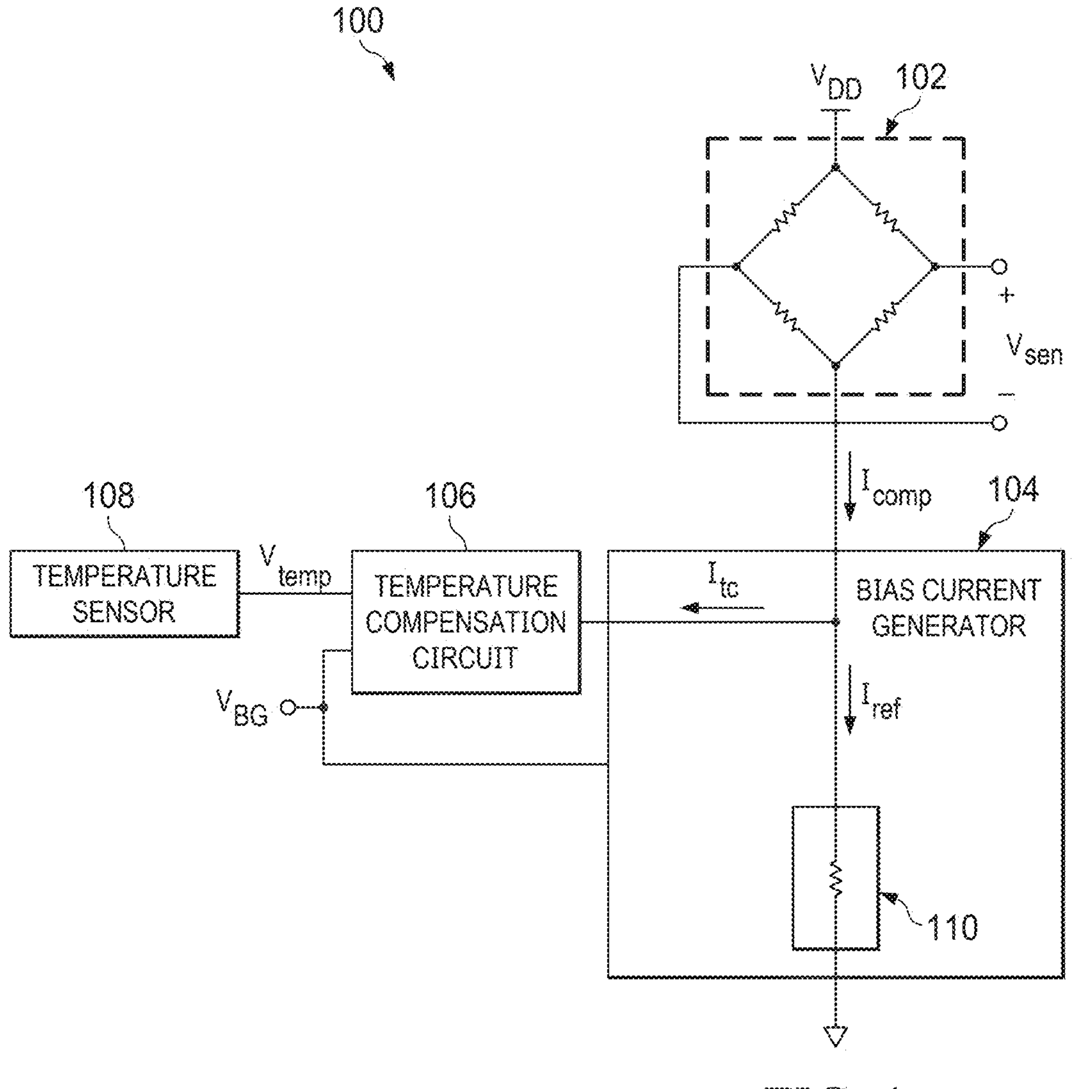
FIG. 1 is a circuit schematic and block diagram illustrating a Hall effect sensor coupled to a bias current generator and a temperature compensation circuit.

FIG. 1 illustrates an example circuit 100 including a Hall effect sensor 102 coupled to a bias current generator 104 and a temperature compensation circuit 106. The circuit 100 further includes a temperature sensor 108. The bias current generator 104 includes a resistor circuit 110.

The bias current generator 104 has a first input, a second input, a first terminal, and a second terminal. The resistor circuit 110 has a first terminal and a second terminal coupled to the first terminal and the second terminal of the bias current generator 104 respectively.

The temperature compensation circuit 106 has a first input, a second input coupled to the first input of the bias current generator 104, and an output coupled to the second input of the bias current generator. The temperature sensor 108 has an output coupled to the first input of the temperature compensation circuit 106.

The Hall effect sensor 102 has a first terminal coupled to the first terminal of the bias current generator 104, a second terminal, a third, terminal, and a fourth terminal. In the example of FIG. 1, the Hall effect sensor 102 is illustrated/modeled by four resistors in a Wheatstone bridge configuration. However, the Hall effect sensor 102 may also have a different structure upon a physical chip. For example, the Hall effect sensor 102 is formed as a deep N well structure upon a semiconductor substrate, or is formed as a thin strip of metal.

The bias current generator 104 receives a voltage $V_{BG}$ on its first input. In some examples, the voltage $V_{BG}$ is a bandgap voltage, which experiences little to no variation in voltage with respect to temperature. Responsive to the voltage $V_{BG}$, the bias current generator 104 generates a reference current $I_{ref}$. For example, the bias current generator 104 generates the reference current $I_{ref}$ based on the voltage $V_{BG}$ and a resistance of the resistor circuit 110 (e.g., according to Ohm's law). Although not illustrated for simplicity, the bandgap voltage $V_{BG}$ may be generated, for example, using bandgap voltage reference circuitry.

In the illustrated example, the reference current $I_{ref}$ is used to bias the Hall effect sensor 102. When biased with a current, the Hall effect sensor 102 produces a differential voltage $V_{sen}$ (also referred to herein as a sense voltage) across its third and fourth terminals responsive to a magnetic field sensed by the Hall effect sensor 102. The voltage $V_{sen}$ may further be based on (e.g., a function of) the current used to bias the Hall effect sensor 102 and a magnetic sensitivity of the Hall effect sensor 102.

A common use case of Hall effect sensors is to measure magnetic field. In such use cases, it is beneficial to have a sense voltage $V_{sen}$ (e.g., the measurement of the magnetic field) that is directly proportional to the sensed magnetic field. In some examples, the magnetic sensitivity is a characteristic of the Hall effect sensor 102 that varies across temperature, which can affect the sense voltage $V_{sen}$ and negatively impact the accuracy of the Hall effect sensor 102. For example, for a given magnetic field, the sense voltage $V_{sen}$ produced by the Hall effect sensor 102 varies across temperature due to the variations in the magnetic sensitivity.

Accordingly, to compensate for temperature variations and improve the accuracy of the Hall effect sensor 102, the circuit 100 further includes the temperature compensation circuit 106 and the temperature sensor 108. The temperature sensor outputs a voltage $V_{temp}$ responsive to a sensed temperature, which is received by the temperature compensation circuit 106 on its first input. The temperature compensation circuit 106 receives the bandgap voltage $V_{BG}$ on its second input. Based on the voltages $V_{BG}$ and $V_{temp}$, the temperature compensation circuit 106 generates a temperature compensation current $I_{tc}$, which is provided to the second input of the bias current generator 104.

As shown, the temperature compensation current $I_{tc}$ is added with the reference current $I_{ref}$ to produce a compensated current $I_{comp}$ (e.g., according to Kirchoff's current law), which is used to bias the Hall effect sensor 102. When used as the bias current, the compensated current $I_{comp}$ applies the temperature compensation to the Hall effect sensor 102 by effectively "canceling out" any variations in $V_{sen}$ due to variations in the magnetic sensitivity of the Hall effect sensor.

In some examples, the temperature compensation circuit 106 is further structured to generate the temperature compensation current $I_{tc}$ based on a type of the Hall effect sensor 102. For example, the temperature compensation circuit 106 is calibrated for different types of Hall effect sensors to model the behavior (e.g., magnetic sensitivity response) of the Hall effect sensor with respect to temperature. Although the temperature compensation current $I_{tc}$ is illustrated as flowing in a particular direction, the temperature compensation current $I_{tc}$ may be a positive or a negative current (e.g., depending on the sensed temperature), and thus may alternatively be illustrated as flowing in the opposing direction.

In some examples, the temperature compensation circuit 106 is a second order temperature compensation circuit. For example, the temperature compensation current $I_{tc}$ provided by the temperature compensation circuit 106 follows a second order equation. Using second order temperature compensation furthers improve the accuracy of the Hall effect sensor 102, for example, when the variation of the magnetic sensitivity of the Hall effect sensor 102 across temperature follows a parabolic curve.

In addition, the reference current $I_{ref}$ may also experience variations, which can further reduce the accuracy of the Hall effect sensor 102. For example, a resistance of the resistor circuit 110 may vary with process variations and/or temperature variations, which results in variance in the reference current $I_{ref}$.

In some examples, the variance in the reference current $I_{ref}$ due to process variations is compensated by "matching" the resistor circuit 110 with the Hall effect sensor 102. For example, an additional Hall effect sensor of a same or similar type and/or specifications as the Hall effect sensor 102 is used as the resistor circuit 110 to generate the reference current $I_{ref}$. In other examples, a trimmable resistor is used as the resistor circuit 110, and the resistor circuit 110 is trimmed/adjusted to compensate for the process variations.

In some examples, when using a Hall effect sensor as the resistor circuit 110, the resistor circuit 110 experiences relatively higher variations in resistance across temperature. For example, a deep N well structure used to form the Hall effect sensor may experience relatively higher variations in resistance across temperature when compared to other types of resistors (e.g., polysilicon resistors). In such examples, to further improve the accuracy of the Hall effect sensor 102, the temperature compensation circuit 106 can be calibrated to provide the temperature compensation current $I_{tc}$ to compensate for variations in the resistance of the additional Hall effect sensor as the resistor circuit 110.

In some examples, the Hall effect sensor 102, the bias current generator 104, the temperature compensation circuit 106, and the temperature sensor 108 are included on a single semiconductor substrate or "chip". In other examples, one or more of these components are included on different chips.

Figure 2:
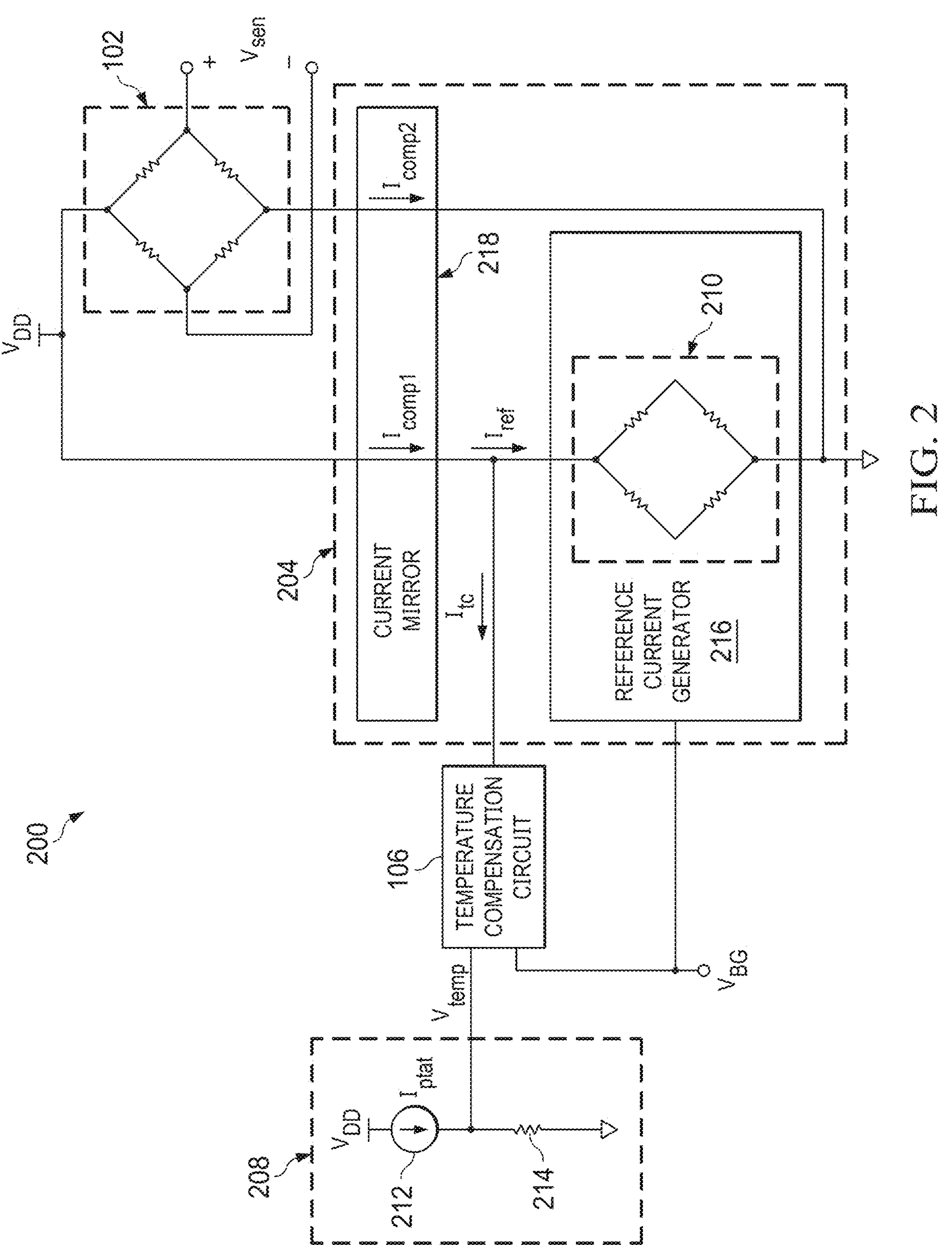
FIG. 2 is a circuit schematic and block diagram illustrating the circuit of FIG. 1 including an additional Hall effect sensor for generating the bias current.

FIG. 2 illustrates an example circuit 200. In some examples the circuit 200 is a variation of the circuit 100 of FIG. 1, with an additional Hall effect sensor 210 as an example implementation of the resistor circuit 110. Further, the circuit 200 illustrates a bias current generator 204 and a temperature sensor 208, which may be example implementations of the bias current generator 104 and the temperature sensor 108 of FIG. 1 respectively.

As illustrated in FIG. 2, the temperature sensor 208 includes a current source 212 and a resistor circuit 214. As illustrated in FIG. 2, the resistor circuit 214 includes a single resistor. The bias current generator 204 includes a reference current generator 216 and a current mirror 218. In the example of FIG. 2, the bias current generator 204 further has a third terminal, which is coupled to the second terminal of the Hall effect sensor 102. As shown, a supply voltage $V_{DD}$ is received upon the third terminal of the bias current generator 204.

The current source 212 has an input and an output. The resistor circuit 214 has a first terminal coupled to the output of the current source 212 and coupled to the output of the temperature sensor 208, and a second terminal.

The reference current generator 216 includes the additional Hall effect sensor 210 (e.g., as an example implementation of the resistor circuit 110). The reference current generator 216 has an input coupled to the first input of the bias current generator 204, a first terminal coupled to the first terminal of the additional Hall effect sensor 210, and a second terminal coupled to the second terminal of the additional Hall effect sensor 210 and coupled to the second terminal of the bias current generator 204.

The current mirror 218 has a first terminal coupled to the third terminal of the bias current generator 204, a second terminal coupled to first terminal of the reference current generator 216 and coupled to the second input of the bias current generator 204, a third terminal coupled to the first terminal of the bias current generator 204, and a fourth terminal coupled to the second terminal of the bias current generator 204.

In some examples, the current source 212 is a proportional to absolute temperature (PTAT) current source. For example, a current provided by the current source 212 is proportional to an absolute temperature of the current source 212. Furthermore, the resistor circuit 214 may include a zero-temperature coefficient (ZTC) resistor, such that a resistance of the ZTC resistor has little to no variation with respect to temperature. Thus, according to Ohm's law, the temperature sensor 208 outputs a voltage $V_{temp}$ that is directly proportional to a sensed temperature (e.g., the temperature of the current source 212).

The current mirror 218 is structured to produce a second compensated current $I_{comp2}$ responsive to a first compensated current $I_{comp1}$. As shown, the first compensated current $I_{comp1}$ is equal to the sum of the currents $I_{ref}$ and $I_{tc}$. The second compensated current $I_{comp2}$ is provided to the Hall effect sensor 102. In some examples, the second compensated current $I_{comp2}$ is equal to the first compensated current $I_{comp1}$. In other examples, the second compensated current $I_{comp2}$ is proportional to the first compensated current $I_{comp1}$ according to a gain of the current mirror 218.

In some examples, as shown in FIG. 2, to reduce or minimize inaccuracies in the bias current (e.g., $I_{comp2}$) for the Hall effect sensor 102 due to process variations, the additional Hall effect sensor 210 is used to implement the resistor circuit 110 of FIG. 1. For example, the additional Hall effect sensor is "matched" (e.g., is of the same type/specifications) with the Hall effect sensor 102. Furthermore, the reference current generator 216 is structured to generate the current $I_{ref}$. $I_{ref}$ impacts the bias current $I_{comp2}$ via the current mirror 218, based on the voltage $V_{BG}$ and the resistance of the additional Hall effect sensor 210 (e.g., according to Ohm's law). By utilizing the additional Hall effect sensor 210 as the resistor circuit 110, process variations (e.g., variations in resistance) of the Hall effect sensor 102 are "tracked" by the reference current generator 216, thereby improving the accuracy of the Hall effect sensor 102 when measuring magnetic field.

Figure 3:
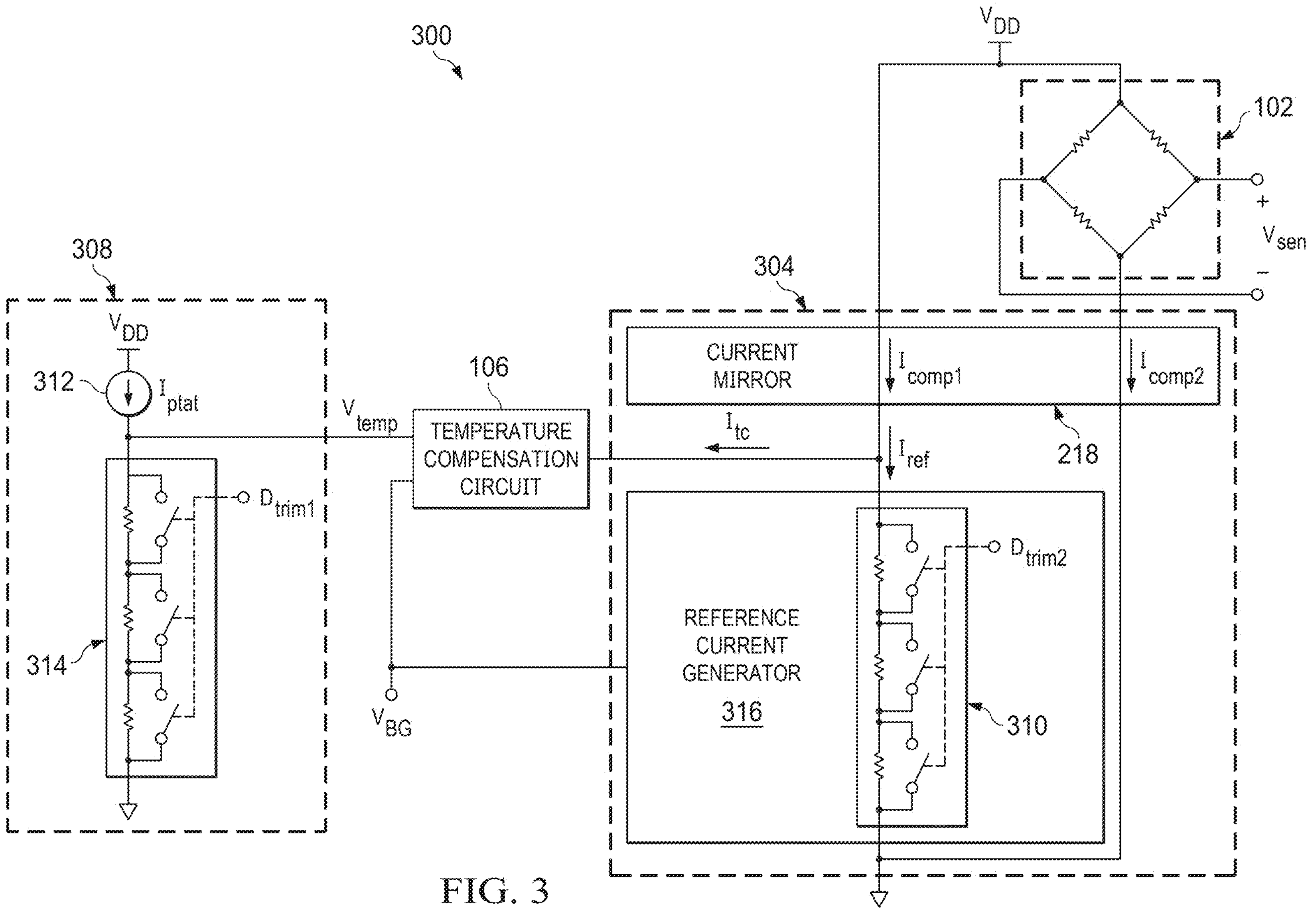
FIG. 3 is a circuit schematic and block diagram illustrating the circuit of FIG. 1 including a trimmable resistor for generating the bias current.

FIG. 3 illustrates an example circuit 300. In some examples, the circuit 300 is a variation of the circuits 100, 200 of FIGS. 1, 2, with a resistor circuit 310 (e.g., a trimmable resistor) as an example implementation of the resistor circuit 110. Further, the circuit 300 illustrates a bias current generator 304 and a temperature sensor 308, which may be example implementations of the bias current generator 104 and temperature sensor 108 of FIG. 1, respectively. Also, the circuit 300 illustrates a reference current generator 316 in place of the reference current generator 216 of FIG. 2.

The temperature sensor 308 resembles the temperature sensor 208 of FIG. 2, but includes a current source 312 and a resistor circuit 314 in place of the current source 212 and the resistor circuit 214 of FIG. 2, respectively. The resistor circuit 314 has an input upon which a signal $D_{trim1}$ is received. In some examples, the signal $D_{trim1}$ is a digital signal used to trim a resistance of the resistor circuit 314. For example, responsive to the signal $D_{trim1}$, the resistor circuit 314 adjusts its resistance. In the illustrated example, the resistor circuit 314 includes a plurality of resistors each having a first terminal and a second terminal, arranged in series. Accordingly, as shown, a first resistor (e.g., illustrated as the top resistor) has a first terminal coupled to the first terminal of the resistor circuit 314, and a second terminal. A second resistor has a first terminal coupled to the second terminal of the first resistor, and a second terminal. A third resistor has a first terminal coupled to the second terminal of the second resistor, and a second terminal coupled to the second terminal of the resistor circuit 314. Although 3 resistors are shown in the illustrated example, other examples may include more or fewer resistors. Further, a plurality of switches are each coupled to a respective resistor. Accordingly, the first and second terminals of each resistor are coupled to a first terminal and a second terminal respectively of a corresponding switch. Furthermore, the switches have control terminals coupled to the input of the resistor circuit 314, such that the signal $D_{trim1}$ is used to open/close various combinations of the switches. By opening and closing the switches, the resistors can be selectively bypassed to adjust the resistance of the resistor circuit 314.

The bias current generator 304 resembles the bias current generator 204 of FIG. 2, but includes the reference current generator 316 as an example implementation of the reference current generator 216. Further, the reference current generator 316 resembles the reference current generator 216 of FIG. 2, but includes a resistor circuit 310 in place of the additional Hall effect sensor 210. A similar circuit and logic can be applied to the resistor circuit 310 of FIG. 3 as used for the resistor circuit 314. As shown, the resistor circuit 310 has an input upon which a signal $D_{trim2}$ is received. The signal $D_{trim2}$ may be a digital signal used to trim a resistance of the resistor circuit 310, such that the resistor circuit 310 adjusts its resistance responsive to the signal $D_{trim2}$. For example, the signal $D_{trim2}$ is used to open/close one or more switches of the resistor circuit 310 to selectively bypass one or more resistors of the resistor circuit 310. As shown, a first resistor (e.g., illustrated as the top resistor) has a first terminal coupled to the first terminal of the resistor circuit 310, and a second terminal. A second resistor has a first terminal coupled to the second terminal of the first resistor, and a second terminal. A third resistor has a first terminal coupled to the second terminal of the second resistor, and a second terminal coupled to the second terminal of the resistor circuit 310. Although 3 resistors are shown in the illustrated example, other examples may include more or fewer resistors. Further, a plurality of switches are each coupled to a respective resistor. Accordingly, the first and second terminals of each resistor are coupled to a first terminal and a second terminal respectively of a corresponding switch.

In some examples, the series of resistors of the resistor circuit 310 are polysilicon resistors, metal resistors, thin film resistors, diffused resistors, or another suitable type of resistor. When compared to using a Hall effect sensor as the resistor circuit (e.g., as in FIG. 2), such resistors may experience less variation in resistance over temperature. Accordingly, in the circuit 300 of FIG. 3, the magnitude of the temperature compensation current $I_{tc}$ for a given temperature should be relatively smaller when compared to the circuit 200 of FIG. 2. Additionally, the signal $D_{trim2}$ may be used to trim the resistor circuit 310 to "match" the Hall effect sensor 102 and compensate for any variance (e.g., of resistance) in the Hall effect sensor 102 due to process variations. Also, the signal $D_{trim1}$ may be used to trim the resistor circuit 314 and further improve the accuracy of the temperature compensation via the temperature sensor 108. For example, by trimming the resistor circuit 314, the magnitude and/or sign (e.g., direction) of the temperature compensation current $I_{tc}$ provided can be adjusted with respect to temperature. In some examples, the signals $D_{trim1}$ and $D_{trim2}$ are digital signals. For example, the signal $D_{trim1}$ is a 5 bit digital signal, and the signal $D_{trim2}$ is a 6 bit digital signal. Although specific bit lengths are given, the bit lengths of the signals $D_{trim1}$ and $D_{trim2}$ may be adjusted to achieve a desired level of accuracy for trimming. In some examples, the signals $D_{rim1}$ and $D_{trim2}$ are calibrated when the circuit 300 is fabricated (e.g., in a factory) to compensate for variance due to process variations. In alternative examples, the signals $D_{rim1}$ and $D_{trim2}$ are provided by control circuitry, and may be adjusted in real time.

In some examples, the circuit 300 is used when a higher level of accuracy (when compared to the circuit 200) for the Hall effect sensor 102 is desired. For example, the circuit 300 can be implemented for a Hall effect sensor 102 for 3-dimensional (3D) sensing applications. In such applications, the Hall effect sensor 102 may be used to output precise measurements, which may be represented by a digital output signal having a length of multiple bits. Accordingly, the circuit 300 may include digital to analog (DAC) and/or analog to digital (ADC) circuitry, in order to convert between the analog output of the Hall effect sensor 102 and the digital output signal. Such DAC circuitry may additionally be used to receive/process the digital trim signals $D_{trim1}$ and $D_{trim2}$. By reusing the DAC circuitry, the footprint of the circuit 300 on the chip is minimized. Furthermore, by trimming the resistor circuit 314 and the resistor circuit 310, the accuracy of the circuit 300 is further improved, which is beneficial in 3D sensing applications, etc.

In contrast, the circuit 200 may be used when a cost efficient design for the Hall effect sensor 102 is desired. For example, the circuit 200 may be used in a magnetic switch, where the output is a binary value representing an "on" or "off" state for the magnetic switch. Accordingly, the DAC and/or ADC circuitry may be omitted from the circuit 200 to reduce cost and/or complexity. Furthermore, the resistor trimming circuitry is also omitted from the circuit 200 to reduce cost/complexity. In the circuit 200, the additional Hall effect sensor is used as the resistor circuit 310, which is a more cost efficient way to compensate for process variations when compared to trimming the resistor circuit 310, as in the circuit 300.

Figure 4:
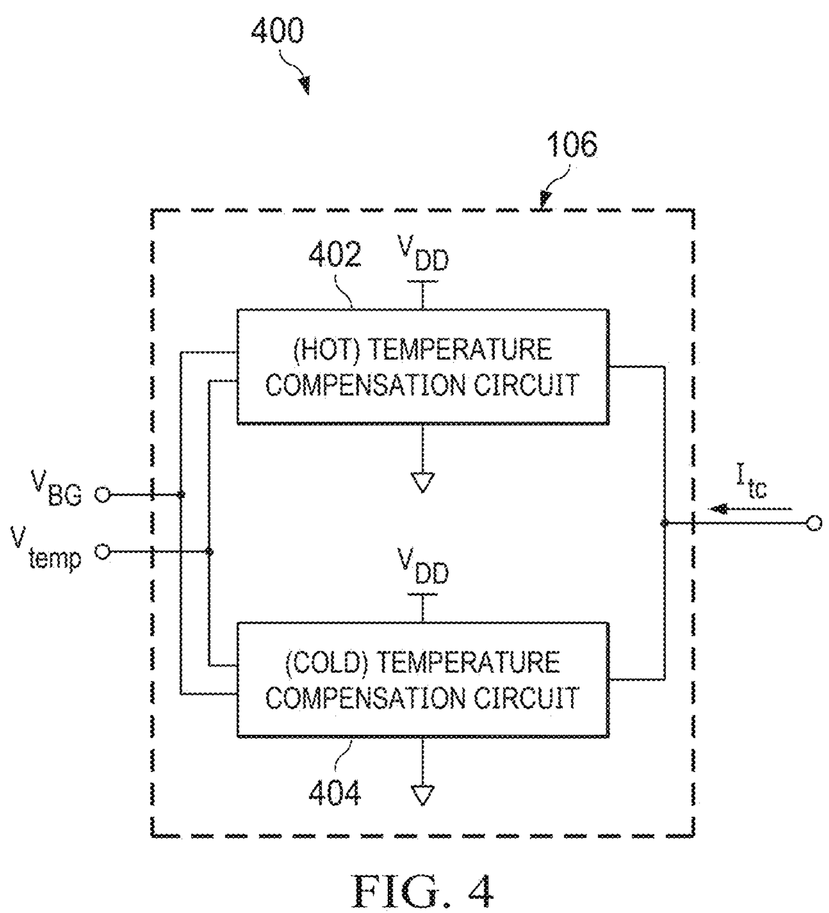
FIG. 4 is a block diagram illustrating further details of the temperature compensation circuit of FIGS. 1-3.

FIG. 4 illustrates an example circuit 400 including further details of the temperature compensation circuit 106 of FIGS. 1-3. As shown, the temperature compensation circuit 106 includes a first temperature compensation circuit 402 and a second temperature compensation circuit 404.

The first temperature compensation circuit 402 has a first input, a second input, and an output coupled to the first input, the second input, and the output of the temperature compensation circuit 106 respectively. The second temperature compensation circuit 404 has a first input, a second input, and an output coupled to the first input, the second input, and the output of the temperature In some examples, the first temperature compensation circuit 402 and the second temperature compensation circuit 404 are used to apply temperature compensation across different temperature ranges. For example, the first temperature compensation circuit 402 (also referred to as a "hot temperature compensation circuit") is used to apply temperature compensation at "hot" temperatures (e.g., temperatures above an equilibrium temperature), and the second temperature compensation circuit 404 (also referred to as a "cold temperature compensation circuit") is used to apply temperature compensation at "cold" temperatures (e.g., temperatures below the equilibrium temperature. In some examples, the first temperature compensation circuit 402 is structured to source current (e.g., negative $I_{tc}$) at the output of the temperature compensation circuit 106. Whereas, the second temperature compensation circuit 404 is structured to sink current (e.g., positive $I_{tc}$) at the output of the temperature compensation circuit.

In some examples, at an equilibrium temperature, the current sourced by the first temperature compensation circuit 402 is equal (or approximately equal) to the current sank by the second temperature compensation circuit 404. The equilibrium temperature, thereby results in a value of zero for the temperature compensation current $I_{tc}$. Above the equilibrium temperature, the magnitude of the current sourced by the first temperature compensation circuit 402 exceeds the magnitude of the current sunk by the second temperature compensation circuit 404, such that the current $I_{tc}$ is negative. Similarly, below the equilibrium temperature, magnitude of the current sunk the second temperature compensation circuit 404 exceeds the magnitude of the current sourced by the first temperature compensation circuit 402, such that the current $I_{tc}$ is positive.

The temperature may be represented by the voltage $V_{temp}$ output by the temperature sensor (e.g., 108), as previously described. In some examples, the equilibrium temperature is approximately equal to a room temperature, or an average temperature around which the system is expected to be operating in. The equilibrium temperature may be determined by the design of the temperature compensation circuits 402, 404. Accordingly, by changing the specifications of the components used to construct the temperature compensation circuits 402, 404, the equilibrium temperature may be adjusted. In some examples, such as FIG. 3, the equilibrium temperature can further be adjusted by trimming the resistor circuit 314 using the signal $D_{trim1}$.

In some examples, a relationship between the temperature compensation current $I_{tc}$ and the voltage $V_{temp}$ (e.g., temperature) is modeled by a second order equation. For example, the first temperature compensation circuit 402 and/or the second temperature compensation circuit 404 can include/utilize metal-oxide-semiconductor field-effect transistors (MOSFETs) operating in the saturation region to generate the second order current. For example, an output current $I_D$ provided by a N-channel metal-oxide-semiconductor (NMOS) transistor operating in the saturation is a function of $(V_{gs}-V_{tn})^2$, where $V_{gs}$ is a differential voltage between a gate and source of the NMOS transistor, and $V_{tn}$ is a threshold voltage of the NMOS transistor. The first temperature compensation circuit 402 and/or the second temperature compensation circuit 404 can utilize the voltage $V_{temp}$ as the gate voltage $V_g$ and the output current $I_D$ as the temperature compensation current $I_{tc}$ to create the second order relationship between $I_{tc}$ and $V_{temp}$. By utilizing a second order $I_{tc}$, the accuracy of the temperature compensation may be further increased, since the magnetic sensitivity of the Hall effect sensor (e.g., 102) may vary over temperature according to a parabolic curve.

In some examples, only the first temperature compensation circuit 402 or the second temperature compensation circuit 404 (but not both) is included within the temperature compensation circuit 106. For example, in applications where the temperature is expected to remain above a certain temperature, only the first temperature compensation circuit 402 can be included to reduce cost/complexity. Similarly, in applications where the temperature is expected to remain below a certain temperature, only the second temperature compensation circuit 404 can be included.

Figure 5:
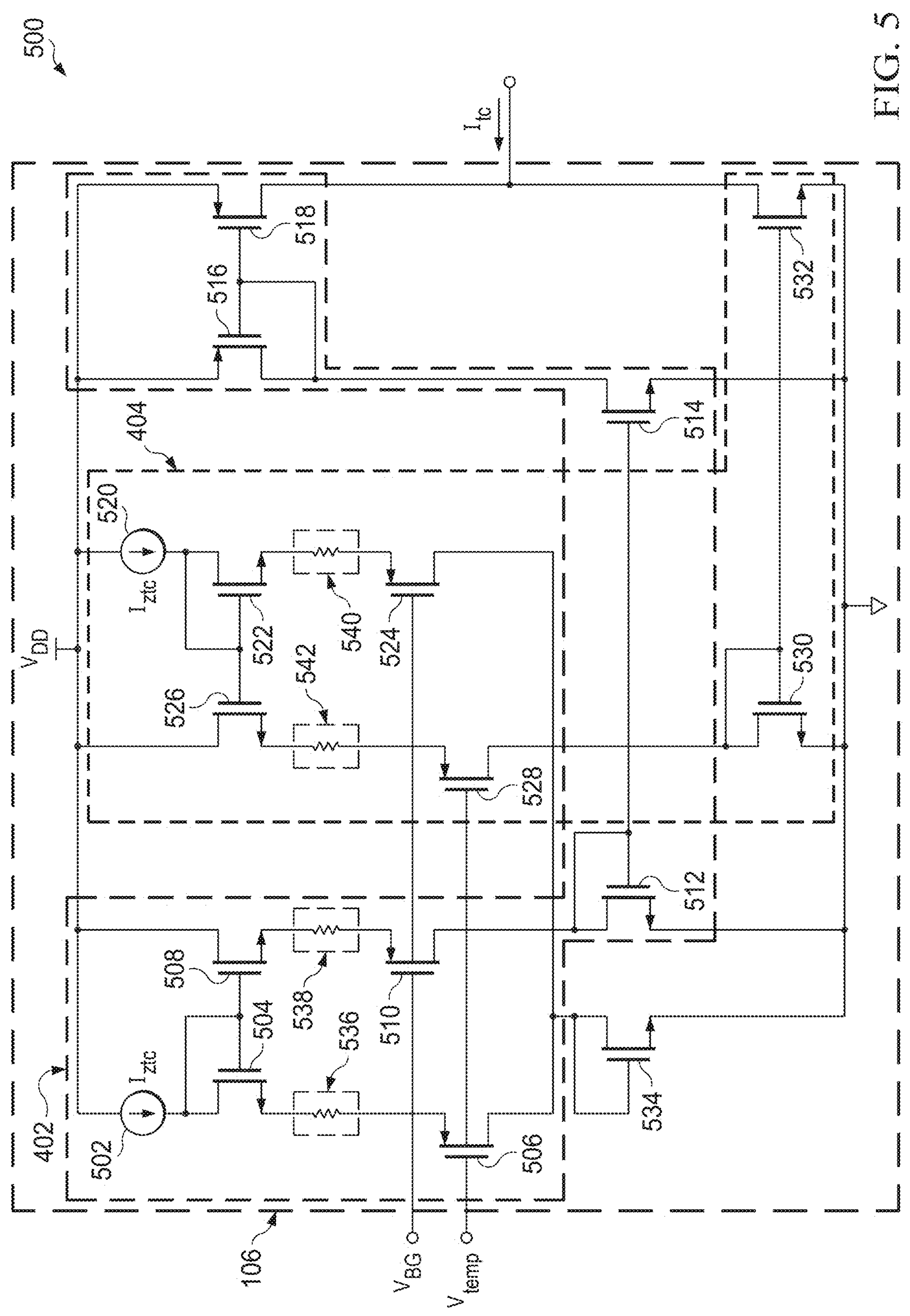
FIG. 5 is a circuit schematic illustrating further details of the temperature compensation circuit of FIGS. 1-4.

FIG. 5 illustrates a circuit 500 including further details of the temperature compensation circuit 106 of FIG. 4. As shown, the first temperature compensation circuit 402 includes a (first) current source 502, a (first) transistor 504, a (second) transistor 506, a (third) transistor 508, a (fourth) transistor 510, a (fifth) transistor 512, a (sixth) transistor 514, a (seventh) transistor 516, and an (eighth) transistor 518. The second temperature compensation circuit 404 includes a (second) current source 520, a (ninth) transistor 522, a (tenth) transistor 524, an (eleventh) transistor 526, a (twelfth) transistor 528, a (thirteenth) transistor 530, and a (fourteenth) transistor 532. The temperature compensation circuit 106 further includes a (fifteenth) transistor 534. Optionally, the first temperature compensation circuit 402 further includes a (first) resistor 536 and a (second) resistor 538, and the second temperature compensation circuit 404 further includes a (third) resistor 540 and a (fourth) resistor 542.

The current source 502 has an input and an output. The transistor 504 has a first terminal coupled to the output of the current source 502, a second terminal, and a control terminal coupled to the first terminal. The transistor 506 has a first terminal coupled to the second terminal of the transistor 504, a second terminal, and a control terminal coupled to the first input of the temperature compensation circuit 106 (also coupled to the first input of 402). The transistor 508 has a first terminal coupled to the input of the current source 502, a second terminal, and a control terminal coupled to the control terminal of the transistor 504. The transistor 510 has a first terminal coupled to the second terminal of the transistor 508, a second terminal coupled to the output of the temperature compensation circuit 106, and a control terminal coupled to the second input of the temperature compensation circuit 106 (also coupled to the second input of 402).

The second terminal of the transistor 510 is coupled to the output of the temperature compensation circuit 106 via the transistors 512, 514, 516, 518. In some examples, the transistors 512, 514, 516, 518 collectively form a current mirror. As shown, the transistor 512 has a first terminal coupled to the second terminal of the transistor 510, a second terminal, and a control terminal coupled to the first terminal. The transistor 514 has a first terminal, a second terminal coupled to the second terminal of the transistor 512, and a control terminal coupled to the control terminal of the transistor 512. The transistor 516 has a first terminal coupled to the input of the current source 502, a second terminal coupled to the first terminal of the transistor 514, and a control terminal coupled to the second terminal. The transistor 518 has a first terminal coupled to the first terminal of the transistor 516, a second terminal coupled to the output of temperature compensation circuit 106 (also coupled to the output of 402), and a control terminal coupled to the control terminal of the transistor 516.

The current source 520 has an input coupled to the input of the current source 502, and an output. The transistor 522 has a first terminal coupled to the output of the current source 520, a second terminal, and a control terminal coupled to the first terminal. The transistor 524 has a first terminal coupled to the second terminal of the transistor 522, a second terminal, and a control terminal coupled to the second input of the temperature compensation circuit 106 (also coupled to the second input of 404). The transistor 526 has a first terminal coupled to the input of the current source 520, a second terminal, and a control terminal coupled to the control terminal of the transistor 522. The transistor 528 has a first terminal coupled to the second terminal of the transistor 526, a second terminal coupled to the output of the temperature compensation circuit 106 (also coupled to the output of 404), and a control terminal coupled to the first input of the temperature compensation circuit 106 (also coupled to the first input of 404).

The second terminal of the transistor 528 is coupled to the output of the temperature compensation circuit 106 via the transistors 530, 532. In some examples, the transistors 530, 532 collectively form a current mirror. As shown, the transistor 530 has a first terminal coupled to the second terminal of the transistor 528, a second terminal, and a control terminal coupled to the first terminal. The transistor 532 has a first terminal coupled to the output of the temperature compensation circuit 106 (also coupled to the output of 214), a second terminal coupled to the second terminal of the transistor 530, and a control terminal coupled to the control terminal of the transistor 530.

As shown, the transistor 534 has a first terminal coupled to the second terminal of the transistor 506 and the second terminal of the transistor 524, a second terminal coupled to the second terminals of the transistors 512, 514, 530, 532, and a control terminal coupled to the first terminal.

As mentioned above, the resistors 536, 538, 540, 542 may optionally be included in the circuit 500. When present, the resistor 536 has a first terminal coupled to the second terminal of the transistor 504 and a second terminal coupled to the first terminal of the transistor 506. The resistor 538 has a first terminal coupled to the second terminal of the transistor 508 and a second terminal coupled to the first terminal of the transistor 510. The resistor 540 has a first terminal coupled to the second terminal of the transistor 522 and a second terminal coupled to the first terminal of the transistor 524. The resistor 542 has a first terminal coupled to the second terminal of the transistor 526 and a second terminal coupled to the first terminal of the transistor 528.

In some examples, the specifications of the transistors included within the temperature compensation circuit 106 may be selected to set the equilibrium temperature, as discussed with reference to FIG. 4. For example, transistors with a specific length and/or width may be selected based on the desired equilibrium temperature. In some examples, the transistors 504, 508 have a same length and width, which may be the same or different than the length/width of other transistors in the circuit. Similarly, the transistors 522, 526 have a same length and width, which may be the same or different than the length/width of other transistors in the circuit.

In addition to setting the equilibrium temperature, the specifications of the transistors may be used to achieve a specific response (e.g., relationship between $I_{tc}$ and $V_{temp}$). Accordingly, transistors with certain specifications (e.g., length, width, etc.) based on the desired relationship between $I_{tc}$ and $V_{temp}$, which may be different for different Hall effect sensors. By calibrating the temperature compensation circuit 106 for different Hall effect sensors, more accurate temperature compensation can be provided.

When present, the resistors 536, 538, 540, 542 may also be selected to set the equilibrium temperature and/or $I_{tc}$ response. In some examples, including and adjusting the resistors 536, 538, 540, 542 provides further accuracy in tuning the temperature compensation circuit 106 when compared to adjusting the transistors alone.

In some examples, the current sources 502, 520 are ZTC current sources. For example, the current sources 502, 520 provide currents that are constant relative to temperature. In some examples, the transistors are MOSFETs. For example, the transistors 504, 508, 512, 514, 522, 526, 530, 532, 534 are NMOS transistors, and the transistors 506, 510, 516, 518, 524, 528 are P-channel metal-oxide-semiconductor (PMOS) transistors.

As shown, the input of the current sources 502, 520, and the first terminals of the transistors 508, 516, 518, 526 are coupled to a supply voltage $V_{DD}$. Furthermore, the second terminals of the transistors 512, 514, 530, 532, 534 are coupled to ground.

Figure 6:
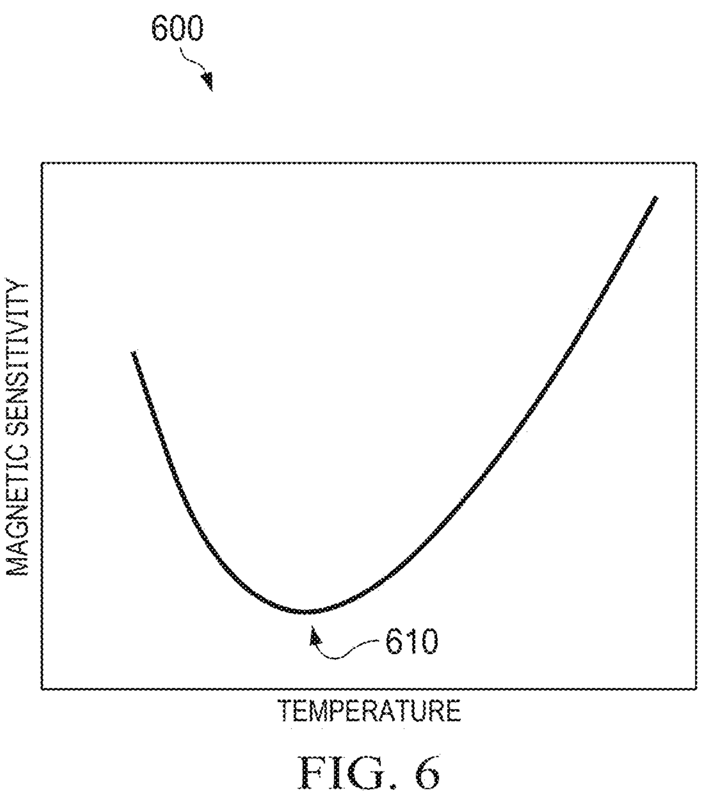
FIG. 6 is a waveform diagram illustrating a magnetic sensitivity of a Hall effect sensor over temperature.

FIG. 6 illustrates a magnetic sensitivity 600 of a Hall effect sensor (e.g., 102) over temperature.

As shown, the magnetic sensitivity 600 approximately follows a parabolic curve. In some examples, the temperature compensation circuit (e.g., 106) is structured to provide the temperature compensation current $I_{tc}$ as an inverse of the parabolic curve of the magnetic sensitivity 600. Accordingly, the temperature compensation current $I_{tc}$ cancels out the variation in the magnetic sensitivity 600 to apply the temperature compensation. The magnetic sensitivity profile may vary depending on a specific type/model of Hall effect sensor. Accordingly, the design of the temperature compensation circuit may be adjusted by adjusting transistors and/or resistors within the temperature compensation circuit, in order to tune the temperature compensation circuit to compensate the specific magnetic sensitivity profile. In some examples, a vertex 610 of the parabola represents the equilibrium temperature, at which no temperature compensation is performed by the temperature compensation circuit (e.g., $I_{tc}$ with a value of zero).

Figure 7:
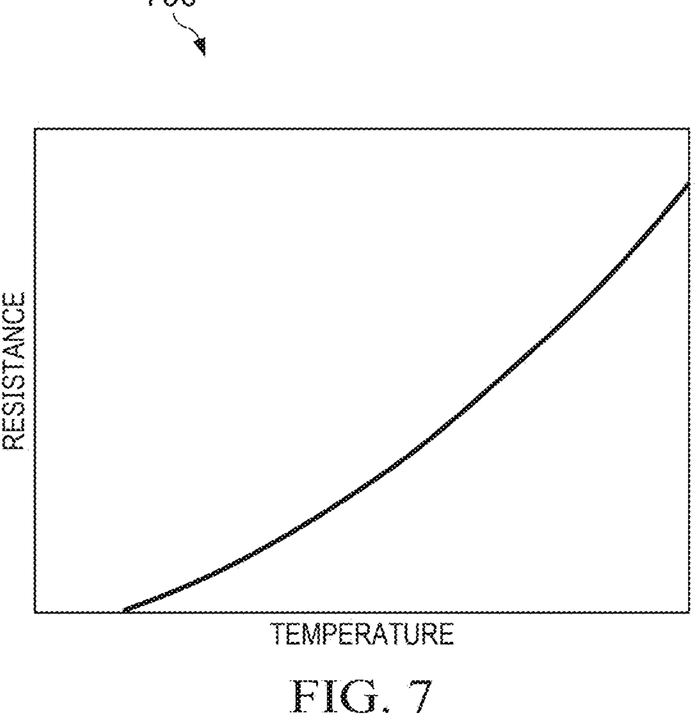
FIG. 7 is a waveform diagram illustrating a resistance of a Hall effect sensor over temperature.

FIG. 7 illustrates a resistance 700 of a Hall effect sensor (e.g., 102 and/or 110) over temperature. In some examples, such as FIG. 2, when using a Hall effect sensor as the resistor circuit (e.g., 110), the temperature compensation circuit is further structured to provide the temperature compensation current $I_{tc}$ to cancel (e.g., compensate) the varying resistance of the hall effect sensor. Similar to FIG. 6, this may be achieved by tuning the temperature compensation circuit to the Hall effect sensor type/model.

Figure 8:
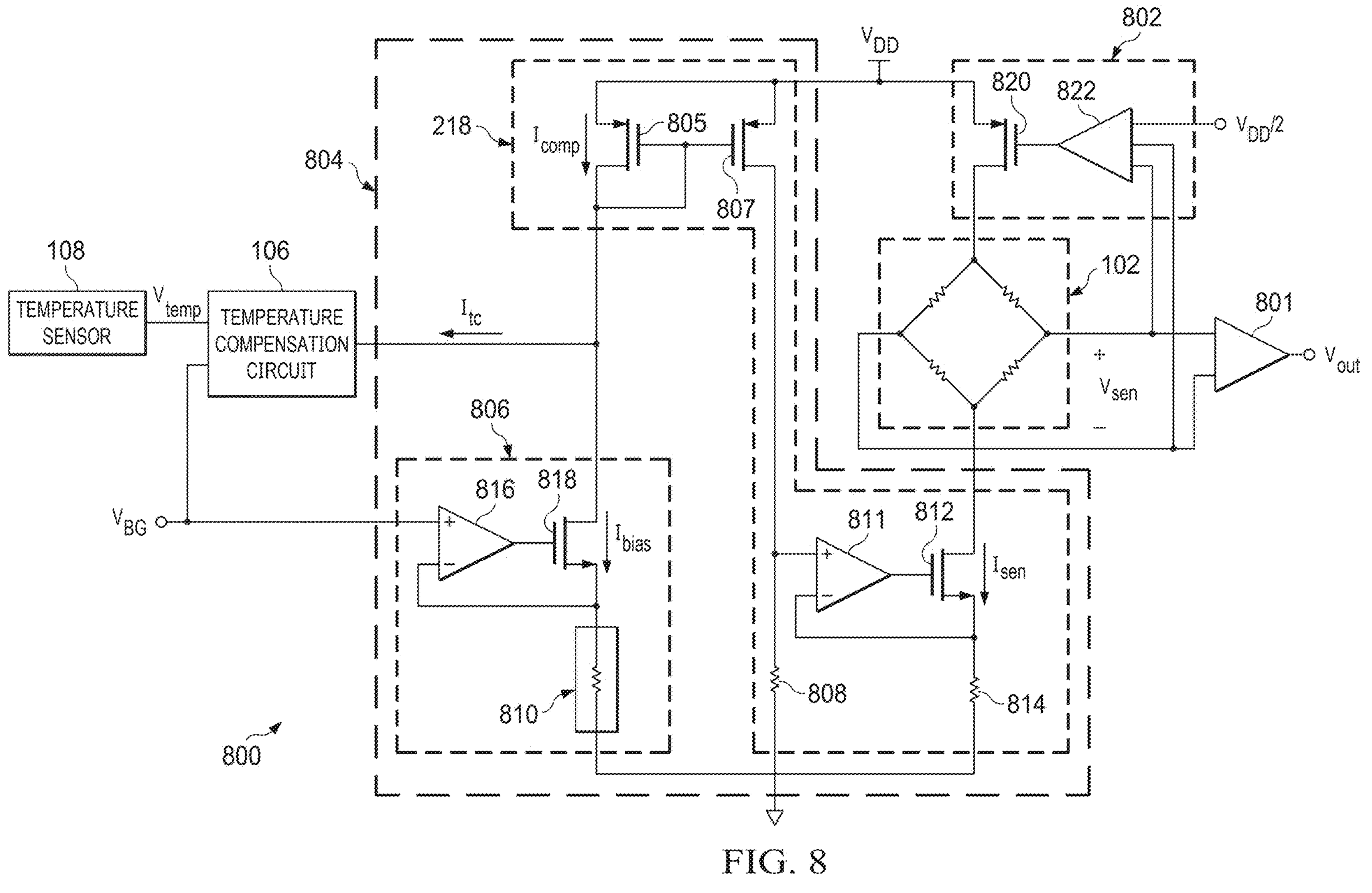
FIG. 8 is a circuit schematic and block diagram illustrating further details of the circuit of FIG. 1, 2, or 3.

FIG. 8 illustrates a circuit 800 which includes further details of the circuit 100 of FIG. 1. As shown, the circuit 800 includes a bias current generator 804 in place of the bias current generator 104/204/304 and a reference current generator 806 in place of the reference current generator 206/306. The circuit 800 also includes a resistor circuit 810 as an example implementation of the resistor circuit 110.

As shown, the circuit 800 further includes a (first) amplifier 801, and a common mode feedback circuit 802. The bias current generator 104 further includes a (first) transistor 805, a (second) transistor 807, a (first) resistor 808, a (second) amplifier 811, a (third) transistor 812, and a (second) resistor 814. The reference current generator 216 further includes a (third) amplifier 816, and a (fourth) transistor 818. The common mode feedback circuit 802 includes a (fifth) transistor 820, and a (fourth) amplifier 822.

The amplifier 801 has first and second inputs coupled to the third and fourth terminals of the Hall effect sensor 102 respectively. Further, the amplifier 801 has an output, at which a voltage $V_{out}$ is provided.

Referring to the common mode feedback circuit 802, the transistor 820 has a first terminal coupled to the third terminal of the bias current generator 104, a second terminal coupled to the second terminal of the Hall effect sensor 102, and a control terminal. The amplifier 822 has a first input, a second input coupled to the first input of the amplifier 801, and a third input coupled to the second input of the amplifier 801. As shown, the transistor 820 receives the supply voltage $V_{DD}$ on its first terminal, and the amplifier 822 receives a voltage division of the supply voltage $V_{DD}/2$ on its first input.

Referring to the current mirror 218, the transistor 805 has a first terminal, a second terminal, and a control terminal coupled to the second terminal. The transistor 807 has a first terminal coupled to the first terminal of the transistor 805, a second terminal, and a control terminal coupled to the control terminal of the transistor 805. The resistor 808 has a first terminal coupled to the second terminal of the transistor 807, and a second terminal. The amplifier 811 has a first input coupled to the first terminal of the resistor 808, a second input, and an output. The transistor 812 has a first terminal coupled to the first terminal of the Hall effect sensor 102, a second terminal coupled to the second input of the amplifier 811, and a control terminal coupled to the output of the amplifier 811. The resistor 814 has a first terminal coupled to the second terminal of the transistor 812, and a second terminal coupled to ground.

Referring to the reference current generator 216, the amplifier 816 has a first input coupled to the input of the reference current generator 216, a second input, and an output. The transistor 818 has a first terminal coupled to the first terminal of the reference current generator 216, a second terminal coupled to the second input of the amplifier 816, and a control terminal coupled to the output of the amplifier 816. The resistor circuit 810 has a first terminal coupled to the second terminal of the transistor 818, and a second terminal coupled to the second terminal of the reference current generator 216. As described with reference to FIGS. 1-3, the resistor circuit 810 may include an additional Hall effect sensor (e.g., 210 of FIG. 2) or a trimmable resistor (e.g., 310 of FIG. 3).

The amplifier 801 amplifies the differential voltage $V_{sen}$ output by the Hall effect sensor 102 to produce the output voltage $V_{out}$. In some examples, the common mode feedback circuit 802 is used to set an operating point of the amplifier 801. For example, the common mode feedback circuit 802 sets a direct current (DC) voltage component of $V_{sen+}$ and $V_{sen-}$ to the voltage $V_{DD}/2$, which may fall in the desired operating region of the amplifier 801 and therefore minimize any variance of the amplifier 801. The second and third inputs of the amplifier 822 receive voltages $V_{sen+}$ and $V_{sen-}$ respectively (e.g., components of the differential voltage $V_{sen}$). In some examples, if an average or common mode of the voltages $V_{sen+}$ and $V_{sen-}$ is greater than $V_{DD}/2$, then the amplifier 822 increases its output voltage (e.g., gate voltage of 820), reducing the current through the transistor 820 and consequently, the current through the Hall effect sensor 102, until the average voltage matches $V_{DD}/2$.

In some examples, a gain of the current mirror 218 is determined based on a ratio between resistances of the resistors 808 and 814.

The methods are illustrated and described above as a series of operations or events, but the illustrated ordering of such operations or events is not limiting. For example, some operations or events may occur in different orders and/or concurrently with other operations or events apart from those illustrated and/or described herein. Also, some illustrated operations or events are optional to implement one or more aspects or examples of this description. Further, one or more of the operations or events depicted herein may be performed in one or more separate operations and/or phases. In some examples, the methods described above may be implemented in a computer readable medium using instructions stored in a memory.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor, a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. Also, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of that parameter. Modifications are possible in the described examples, and other implementations are possible, within the scope of the claims.

What is claimed is:

1. A circuit comprising:

a bias current generator having a first input, a second input, a first terminal, and a second terminal, wherein the bias current generator includes a resistor circuit having first and second terminals coupled to the first and second terminals of the bias current generator respectively;

a temperature compensation circuit having a first input, a second input coupled to the first input of the bias current generator, and an output coupled to the second input of the bias current generator; and a Hall effect sensor having a first terminal coupled to the first terminal of the bias current generator, a second terminal, a third terminal, and a fourth terminal.

2. The circuit of claim 1, wherein the temperature compensation circuit includes:

a first current source having an input and an output;

a first transistor having a first terminal coupled to the output of the first current source, a second terminal, and a control terminal coupled to the first terminal;

a second transistor having a first terminal coupled to the second terminal of the first transistor, a second terminal, and a control terminal coupled to the first input of the temperature compensation circuit;

a third transistor having a first terminal coupled to the input of the first current source, a second terminal, and a control terminal coupled to the control terminal of the first transistor; and a fourth transistor having a first terminal coupled to the second terminal of the third transistor, a second terminal coupled to the output of the temperature compensation circuit, and a control terminal coupled to the first input of the temperature compensation circuit.

3. The circuit of claim 2, wherein the temperature compensation circuit further includes:

a first resistor having a first terminal coupled to the second terminal of the first transistor and a second terminal coupled to the first terminal of the second transistor; and a second resistor having a first terminal coupled to the second terminal of the third transistor and a second terminal coupled to the first terminal of the fourth transistor.

4. The circuit of claim 1, wherein the bias current generator includes a reference current generator having an input coupled to the first input of the bias current generator, a first terminal coupled to the first terminal of the resistor circuit, and a second terminal coupled to the second terminal of the resistor circuit.

5. The circuit of claim 4, wherein the bias current generator further has a third terminal coupled to the second terminal of the Hall effect sensor, and wherein the bias current generator further includes a current mirror having a first terminal coupled to the third terminal of the bias current generator, a second terminal coupled to the second input of the bias current generator, a third terminal coupled to the first terminal of the bias current generator, and a fourth terminal coupled to the second terminal of the bias current generator.

6. The circuit of claim 5, further comprising an amplifier having a first input coupled to the third terminal of the Hall effect sensor, and a second input coupled to the fourth terminal of the Hall effect sensor.

7. The circuit of claim 6, further comprising a common mode feedback circuit having a first input, a second input coupled to the first input of the amplifier, a third input coupled to the second input of the amplifier, a first terminal coupled to the first terminal of the current mirror, a second terminal coupled to the first terminal of the Hall effect sensor.

8. The circuit of claim 1, wherein the resistor circuit includes an additional Hall effect sensor.

9. A circuit comprising:

a reference current generator having an input, a first terminal, and a second terminal, the reference current generator including a resistor circuit having a first terminal coupled to the first terminal of the reference current generator and a second terminal coupled to the second terminal of the reference current generator;

a current mirror having a first terminal, a second terminal coupled to the first terminal of the reference current generator, a third terminal, and a fourth terminal coupled to the second terminal of the reference current generator;

a Hall effect sensor having a first terminal coupled to the first terminal of the current mirror and a second terminal coupled to the third terminal of the current mirror;

a temperature sensor having an output; and a temperature compensation circuit having a first input coupled to the output of the temperature sensor, a second input coupled to the input of the reference current generator, and an output coupled to the second terminal of the current mirror.

10. The circuit of claim 9, wherein the temperature sensor includes:

a proportional to absolute temperature (PTAT) current source having an input, and an output coupled to the output of the temperature sensor; and a zero-temperature coefficient (ZTC) resistor having a first terminal coupled to the output of the PTAT current source, and a second terminal.

11. The circuit of claim 10, wherein the resistor circuit further includes first trimming circuitry configured to adjust a resistance of the resistor circuit responsive to a first digital trimming signal.

12. The circuit of claim 11, wherein the ZTC resistor further includes second trimming circuitry configured to adjust a resistance of the ZTC resistor responsive to a second digital trimming signal.

13. The circuit of claim 11, wherein the resistor circuit includes a polysilicon resistor.

14. The circuit of claim 9, wherein the temperature compensation circuit includes:

a first current source having an input and an output;

a first transistor having a first terminal coupled to the output of the first current source, a second terminal, and a control terminal coupled to the first terminal;

a second transistor having a first terminal coupled to the second terminal of the first transistor, a second terminal, and a control terminal coupled to the first input of the temperature compensation circuit;

a third transistor having a first terminal coupled to the input of the first current source, a second terminal, and a control terminal coupled to the control terminal of the first transistor; and a fourth transistor having a first terminal coupled to the second terminal of the third transistor, a second terminal coupled to the output of the temperature compensation circuit, and a control terminal coupled to the first input of the temperature compensation circuit.

15. A temperature compensation circuit having a first input, a second input, and an output, the temperature compensation circuit comprising:

a first current source having an input and an output;

a first transistor having a first terminal coupled to the output of the first current source, a second terminal, and a control terminal coupled to the first terminal;

a second transistor having a first terminal coupled to the second terminal of the first transistor, a second terminal, and a control terminal coupled to the first input of the temperature compensation circuit;

a third transistor having a first terminal coupled to the input of the first current source, a second terminal, and a control terminal coupled to the control terminal of the first transistor; and a fourth transistor having a first terminal coupled to the second terminal of the third transistor, a second terminal coupled to the output of the temperature compensation circuit, and a control terminal coupled to the second input of the temperature compensation circuit.

16. The temperature compensation circuit of claim 15, further comprising:

a second current source having an input coupled to the input of the first current source, and an output;

a fifth transistor having a first terminal coupled to the output of the second current source, a second terminal, and a control terminal coupled to the first terminal;

a sixth transistor having a first terminal coupled to the second terminal of the fifth transistor, a second terminal coupled to the second terminal of the second transistor, and a control terminal coupled to the second input of the temperature compensation circuit;

a seventh transistor having a first terminal coupled to the input of the second current source, a second terminal, and a control terminal coupled to the control terminal of the fifth transistor; and an eighth transistor having a first terminal coupled to the second terminal of the seventh transistor, a second terminal, and a control terminal coupled to the first input of the temperature compensation circuit.

17. The temperature compensation circuit of claim 16, further comprising:

a ninth transistor having a first terminal coupled to the second terminal of the second transistor and the second terminal of the sixth transistor, a second terminal, and a control terminal coupled to the first terminal.

18. The temperature compensation circuit of claim 16, further comprising:

a first resistor having a first terminal coupled to the second terminal of the first transistor, and a second terminal coupled to the first terminal of the second transistor;

a second resistor having a first terminal coupled to the second terminal of the third transistor, and a second terminal coupled to the first terminal of the fourth transistor;

a third resistor having a first terminal coupled to the second terminal of the fifth transistor, and a second terminal coupled to the first terminal of the sixth transistor; and a fourth resistor having a first terminal coupled to the second terminal of the seventh transistor, and a second terminal coupled to the first terminal of the eighth transistor.

19. The temperature compensation circuit of claim 15, further comprising:

a fifth transistor having a first terminal coupled to the second terminal of the fourth transistor, a second terminal, and a control terminal coupled to the first terminal;

a sixth transistor having a first terminal, a second terminal coupled to the second terminal of the fifth transistor, and a control terminal coupled to the control terminal of the fifth transistor;

a seventh transistor having a first terminal coupled to the input of the first current source, a second terminal coupled to the first terminal of the sixth transistor, and a control terminal coupled to the second terminal; and an eighth transistor having a first terminal coupled to the first terminal of the seventh transistor, a second terminal coupled to the output of the temperature compensation circuit, and a control terminal coupled to the control terminal of the seventh transistor.

20. The temperature compensation circuit of claim 15, wherein the first current source includes a zero-temperature coefficient (ZTC) current source.

* * * * *